United States Patent [19]

Hiraiwa et al.

[11] Patent Number: 5,091,761
[45] Date of Patent: Feb. 25, 1992

[54] SEMICONDUCTOR DEVICE HAVING AN ARRANGEMENT OF IGFETS AND CAPACITORS STACKED THEREOVER

[75] Inventors: Atsushi Hiraiwa, Kodaira; Shinichiro Kimura, Hachioji; Toshiyuki Mine, Hamuramachi; Takashi Kobayashi, Kokubunji; Tokuo Kure, Nishitama; Shinpei Iijima, Akishima; Jiro Yugami, Tokyo, all of Japan

[73] Assignee: Hitachi, Ltd., Tokyo, Japan

[21] Appl. No.: 384,821

[22] Filed: Jul. 25, 1989

[30] Foreign Application Priority Data

Aug. 22, 1988 [JP] Japan .................................. 63-206470
Sep. 14, 1988 [JP] Japan .................................. 63-228579

[51] Int. Cl.[5] ...................... H01L 29/68; H01L 27/02; H01L 27/10
[52] U.S. Cl. ..................................... 357/23.6; 357/41; 357/51; 357/45
[58] Field of Search ......................................... 357/23.6

[56] References Cited

U.S. PATENT DOCUMENTS

| | | | |
|---|---|---|---|
| 4,910,566 | 3/1990 | Ema | 357/23.6 |
| 4,953,126 | 8/1990 | Ema | 357/23.6 |
| 4,958,318 | 9/1990 | Harari | 357/23.6 |
| 4,970,564 | 11/1990 | Kimura et al. | 357/23.6 |

FOREIGN PATENT DOCUMENTS 63-278363 11/1988 Japan .................................. 357/23.6

*Primary Examiner*—Rolf Hille
*Assistant Examiner*—Robert P. Limanek
*Attorney, Agent, or Firm*—Antonelli, Terry, Stout & Kraus

[57] ABSTRACT

Disclosed is a semiconductor device including a charge storage capacitor having a storage electrode which is electrically connected to a switching transistor through a contact hole provided in an insulator and which has a greater film thickness than the radius of the contact hole, at least a part of the storage electrode being disposed above a data line. It is possible to reduce the memory cell area while preventing lowering in the capacitance, and thus realize high density and high integration of semiconductor devices.

42 Claims, 11 Drawing Sheets

SEMICONDUCTOR DEVICE HAVING AN ARRANGEMENT OF IGFETS AND CAPACITORS STACKED THEREOVER

BACKGROUND OF THE INVENTION

The present invention relates to a semiconductor device and a process for producing the same. More particularly, the present invention pertains to a semiconductor device having a memory comprising a capacitor and at least one transistor and also to a process for producing the same.

High integration of semiconductor devices, for example, dynamic random access memories (hereinafter abbreviated as "DRAMs"), has been realized at surprising speed. The mainstream of DRAMs which are presently produced are 256-kilobit DRAMs, but the production of 1-megabit DRAMs has already been initiated. The high integration of semiconductor devices has been achieved mainly by reduction in the size of memory cells. The memory cell area was reduced to about 40% of that required in the previous generation and with respect to each new generation of development, i.e., from 64-kilobit DRAMs to 256-kilobit DRAMs and further to 1-megabit DRAMs. The capacitor area has also been reduced substantially proportionally to the memory cell area. However, if the capacitor area is reduced with the thickness of the capacitor insulator being maintained at a constant level, the capacitance of the storage capacitor decreases, which leads to problems, for example, including a lowering in the signal-to-noise ratio and that pertaining data reversal (so-called soft-errors) due to alpha-particles, and thus resulting in considerably lowering in the reliability. For this reason, the thickness of the capacitor insulator has been reduced in order to prevent a lowering in the capacitance of the storage capacitor when the capacitor area is reduced. In the case of 1-megabit DRAMs, the film thickness of the capacitor insulator has already been reduced to 10 nm in terms of the silicon dioxide equivalent, and in the case of 4-megabit DRAMs, an insulating film having a thickness of from 4 to 6 nm is considered to be needed. The silicon dioxide equivalent thickness d is a film thickness which is calculated from the measured capacitance C assuming that the capacitor insulator is a silicon dioxide film formed by thermal oxidation. It may be expressed as follows:

$$d = \frac{\epsilon S}{C}$$

where S is the capacitor area, and $\epsilon$ is dielectric constant of the silicon dioxide.

As the capacitor insulator becomes reduced in thickness, i.e., is thinned, as described above, a problem which arises is that a tunneling current flows between the electrodes of the capacitor which results in the disappearance or dissipation of the stored charge. This problem is discussed, for example, in Solid-State Electronics, vol. 10, pp. 865–873 (1967).

In order to solve the above-described problem, a capacitor having a stacked structure was proposed and discussed in Japanese Patent Publication No. 61-55258 (1986). In the stacked capacitor, a part of it is formed so as to be stacked over a MOS transistor and over an insulator for isolation, and it is therefore possible to utilize the region over these elements as a part of the capacitor and hence to increase the capacitor area in comparison with the conventional structure wherein the capacitor and the MOS transistor are formed on the same plane. Accordingly, even if an insulator having a thickness of 10 nm in terms of the silicon dioxide equivalent is employed, it is possible to ensure a capacitance needed in a 4-megabit DRAM, and thus it is possible to prevent disappearance of the stored charge.

However, if it is intended to further increase the integration density and to realize a 16-megabit DRAM, for example, it is necessary to employ an insulator having a thickness of about 5 nm in terms of the silicon dioxide equivalent, and the problem of the disappearance of the charge due to the tunneling current arises again. It has been reported that an insulator having a thickness of 5 nm is barely fit for practical application, however, it is extremely difficult to further reduce the film thickness. In addition, as the thickness of the insulator is extremely reduced, it is feared that the yield may be lowered by variations in the film thickness, and it is therefore difficult to further increase the integration density.

It is necessary that in order to increase the capacitance the distance between each pair of adjacent capacitors should be minimized. However, the highest resolution obtained by the existing optical lithography technology regarding such distance is on the order of 0.6 $\mu$m and it is therefore necessary to adopt various complicated techniques in order to reduce the distance between each pair of adjacent capacitor storage electrodes. This problem also hinders achievement of high density and high integration.

SUMMARY OF THE INVENTION

It is an object of the present invention to provide a highly integrated and reliable semiconductor device which is designed so that it is possible to ensure a sufficiently large capacitance without the need to extremely reduce the dimension of the capacitor insulator.

It is another object of the present invention to provide a process for producing a semiconductor device which has high processing accuracy and less contamination and which is suitable for achieving high integration.

The first object of the present invention is attained by a semiconductor device having a memory cell including a capacitor having two electrodes disposed with an insulator interposed therebetween, at least one transistor and a data line connected to the transistor, wherein at least a part of the one of the two electrodes, which is disposed below the other to serve as a storage electrode, is disposed at the upper side of the data line and the thickness of the storage electrode is greater than the radius of a contact hole provided to electrically connect together the storage electrode and a conducting film or a doped region which is provided thereunder.

The second object of the present invention is attained by a process for producing a semiconductor device comprising the steps of: forming a MOS transistor or MOSFET (which may also be referred to hereinafter as insulated-gate field-effect transistor or IGFET) having a source, gate and drain on a semiconductor substrate; forming a data line connected to the drain of the MOS transistor; forming an insulator on the data line and the MOS transistor; forming a contact hole in that portion of the insulator which is directly above the source region of the MOS transistor; forming a storage electrode of a charge storage capacitor which has a thickness greater than the radius of the contact hole by chemical vapor deposition while carrying out doping; forming a capacitor insulator on the storage electrode; forming a plate electrode on the capacitor insulator; forming an insulator on the plate electrode; and forming wirings.

DETAILED DESCRIPTION OF THE PREFERRED EMBODIMENTS

Figure 1:
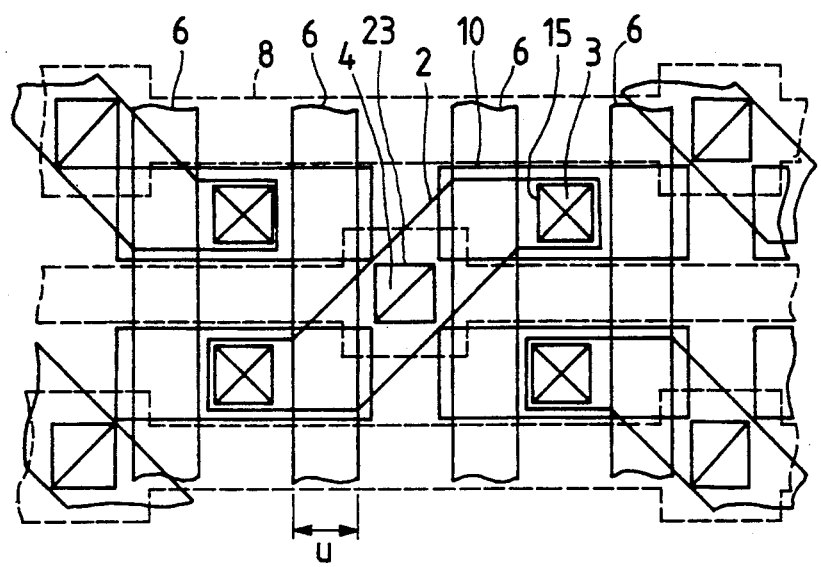
FIGS. 1, 3, 9, 11 and 12 are plan views showing layouts of DRAMs which are employed to describe the present invention.

According to the present invention, the thickness of a lower electrode of a capacitor which serves as a storage electrode is set to as to be greater than the radius of a contact hole which is provided to electrically connect together the storage electrode to the source electrode of a driving MOS transistor. Thus, it is possible to obtain a capacitor which has less contamination and high reliability and which is suitable for achieving high integration. If the thickness of the storage electrode is smaller than the radius of the contact hole, the contact hole would not become completely filled with the storage electrode. A recess which has a small opening diameter and is deep is left in the center of the contact hole, so that the contaminant cannot satisfactorily be removed from the recess in the cleaning step which is carried out before the formation of a capacitor insulator. In addition, a chemical used in the cleaning step may be partially left in the recess to deteriorate the film quality of the capacitor insulator formed in the subsequent step, thus causing the reliability of the resulting semiconductor device to be extremely lowered. Therefore, the thickness of the storage electrode must not be smaller than the radius of the contact hole to obtain a desired semiconductor device.

In the present invention, the side surface of the storage electrode can also be utilized as a part of the capacitor and it is therefore possible to obtain a greater capacitance than that of the conventional capacitor in which the top portion of the storage electrode alone is utilized as a part of the capacitor. More specifically, the area of a capacitor in a DRAM which employs only the top portion of the storage electrode that is, the top or upper surface thereof, as a part of the capacitor decreases substantially proportionally to the memory cell area. In the present invention, however, since the side surface of the storage electrode is also utilized as a part of the capacitor, the capacitor area does not decrease in proportion to the memory cell area and it is possible to increase the capacitance by increasing the thickness of the storage electrode.

The thickness of the storage electrode can be increased by disposing the storage electrode above the data line. In the conventional DRAMs, the data line is generally disposed above the capacitor. With this structure, however, a relatively high step is formed due to the presence of the capacitor and it is therefore likely that the region under the high step will be undesirably left after etching process and a short-circuit will occur between a pair of adjacent data lines when formed in the subsequent step. For this reason, in the conventional structure, the thickness of the storage electrode cannot be increased and is limited to 0.3 μm or less. However, when the storage electrode is disposed above the data line, there is no problem arising from the thickness of the capacitor and it is therefore possible to form a capacitor with a storage electrode having an increased thickness.

Further, the present invention enables the storage electrode to extend over the joint of the data line and the transistor and therefore permits the capacitance of the part of the capacitor which is constituted by the top portion of the storage electrode to be larger than in the case of the conventional structure, so that the overall capacitance of the capacitor is considerably increased.

In addition, since the storage electrode is formed by simultaneously carrying out deposition of polycrystalline silicon and doping process, doping can be uniformly effected over the whole electrode even if the film thickness of the storage electrode is increased. As a result there is, therefore, no fear that the resistance of the storage electrode will increase.

As has been described above, when the side surface of the storage electrode is utilized as a part of the capacitor, the capacitor area does not decrease in proportion to the memory cell area but can be increased by increasing the thickness of the storage electrode. Effectiveness of increase in the capacitance will next be explained with reference to FIGS. 1 to 4. FIG. 1 shows one example of the planar layout of a DRAM having a stacked capacitor in which a storage electrode 10 is disposed above data lines 8. In this figure, the reference numeral 2 denotes an insulator for device isolation, 6 word lines, 15 a contact hole for obtaining electrical contact between a doped region 3 and the storage electrode 10, and 23 a contact hole for obtaining electrical contact between a doped region 4 and a data line 8.

FIG. 1 shows an arrangement wherein the length of each side of the contact holes 15 and 23 and the line width of the data and word lines 8 and 6 are each set at the minimum feature size u in order to achieve high integration of the device. The mask alignment accuracy is assumed to be ½ of the minimum feature size u, and the width of the storage electrode 10 is set at 1.5 u, while the length of the storage electrode 10 which is formed so as to extend over the data line 8 is set at 4 u. In this case, the surface area $S_c$ of the storage electrode 10 may be approximated as being the sum of the respective areas of the top portion and the side wall portion, as follows:

$$S_c = 6 \cdot u^2 + 11 \cdot a \cdot u^2 \qquad (1)$$

$$a = d/u \qquad (2)$$

wherein d is the thickness of the storage electrode 10 which is defined by the maximum thickness value of the portion of the storage electrode 10 except for the contact hole 15.

In comparison between the capacitance at the side wall portion of the storage electrode 10 and that at the top portion, it is assumed that the recessed portion in the top of the electrode 10 is included in the top portion.

Thus, the capacitance $C_s$ of the capacitor may be expressed as follows:

$$C_s = S_c * \epsilon_{ox} * \epsilon_o / d_{ox} \qquad (3)$$

wherein $\epsilon_{ox}$ is the specific dielectric constant of the silicon dioxide film, $\epsilon_o$ is the dielectric constant ($8.854 \times 10^{-14}$ F/cm) in vacuum, and $d_{ox}$ is the silicon dioxide equivalent thickness of the capacitor insulator.

Figure 2:
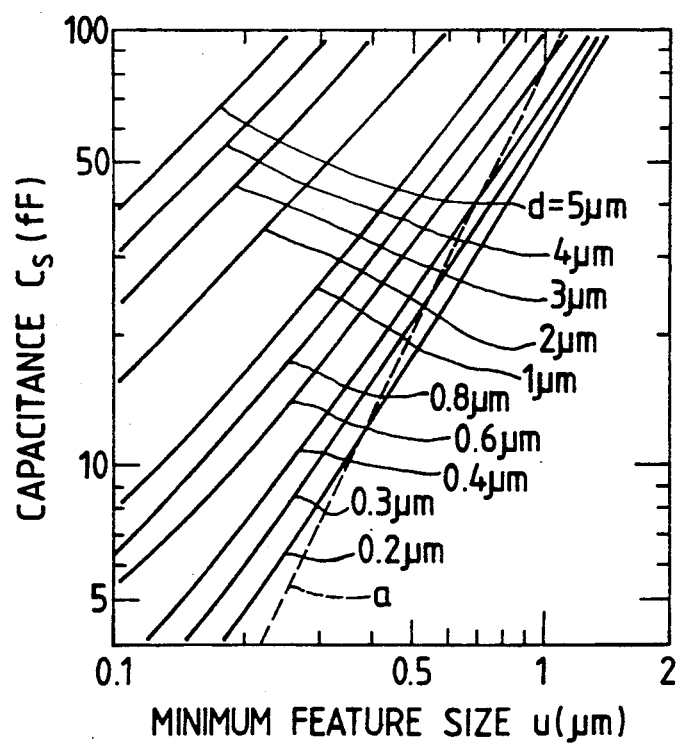
FIGS. 2 and 4 are graphs each showing the relationship between the capacitance and the minimum feature size in the capacitor according to the present invention.

FIG. 2 shows the relationship between the capacitance $C_s$ shown by the expression (3), and the minimum feature size u. It should be noted that the thickness of the capacitor insulator is 5 nm. In the figure, the chain line a shows the relationship between the capacitance $C_s$ and the minimum feature size u in the case where the area of the top portion of the storage electrode 10 is equal to that of the side wall portion thereof. In the region which is above the chain line a, the area of the side wall portion is greater than that of the top portion.

It will be understood from FIG. 2 that, even when the minimum feature size u decreases, for example, to 0.3 μm (this value being considered to be needed to realize a 64-megabit DRAM), a capacitance of 20 fF can be ensured by setting the thickness of the storage electrode at about 0.7 μm. It is said that the signal reversal due to alpha-particles can be prevented if the capacitance is greater than the said value. Since the radius u/2 of the contact hole is 0.15 μm, the thickness of the storage electrode, which is 0.7 μm, is about 5 times the radius of the contact hole. It is understood from FIG. 1 and the expression (1) that the capacitance at the side wall portion of the capacitor is about 4 times the capacitance at the top portion thereof. Thus, it is confirmed that, if the minimum feature size u is 0.3 μm in the planar layout of the DRAM shown in FIG. 1, the thickness of the storage electrode 10 can be set at, for example, 0.7 μm, to realize a 64-megabit DRAM without any problem. In such a case, the film thickness of the storage electrode is about 5 times the radius of the contact hole and the capacitance at the side wall portion of the capacitor is about 4 times that at the top portion thereof.

It is confirmed that, when the minimum feature size u is 0.5 μm, a capacitance of about 25 fF or more is obtained by setting the thickness of the storage electrode 10, for example, at 0.4 μm or more, as will be clear from FIG. 2, and it is possible to prevent the signal reversal due to alpha-particles satisfactorily. In this case, the thickness of the storage electrode is about 1.5 times the radius (0.25 μm) of the contact hole and the capacitance at the side wall portion of the capacitor is 1.5 times that at the top portion thereof.

Figure 3:
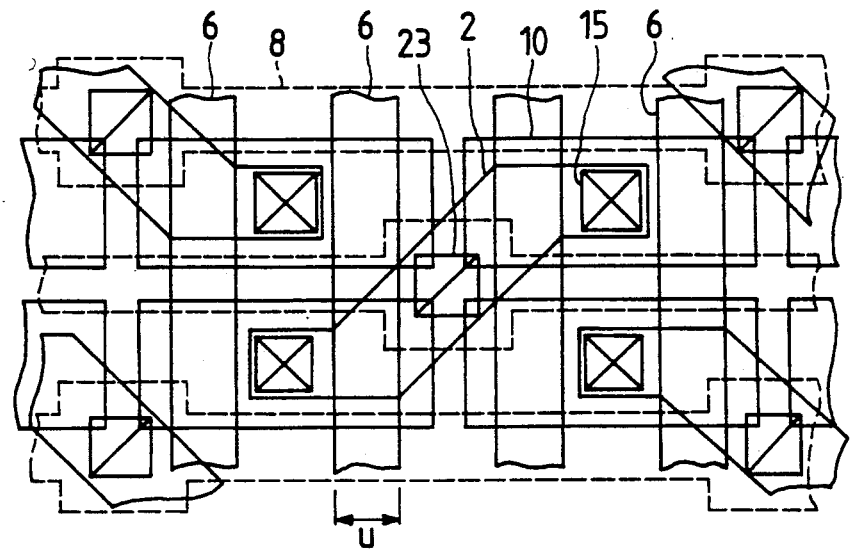

FIG. 3 shows another layout of a DRAM. The size of the contact holes 15 and the like is set at the minimum feature size u in the same way as in FIG. 1. In this layout, before the storage electrode 10 is formed by patterning, a side spacer is self-alignedly formed on the side wall of an etching mask employed in the patterning and, therefore, the distance between the storage electrodes of each pair of adjacent capacitors is less than the minimum feature size u. It should be noted that the side spacer for the etching mask is formed in the manner described below. After an etching mask has been formed by the use of ordinary photo-lithography technique, a silicon dioxide film is formed by the use of plasma-enhanced CVD. Then, the silicon oxide film is etched by dry etching process. As a result, the silicon dioxide film is left only on the side wall of the etching mask to form a side spacer Thus, it becomes possible to set the width and length of the storage electrode 10 at 2 u and 4.5 u, respectively, and the surface area $S_c$ of the storage electrode 10 is expressed as follows:

$$S_c = 9*u^2 + 13*a*u^2 \qquad (4)$$

Figure 4:
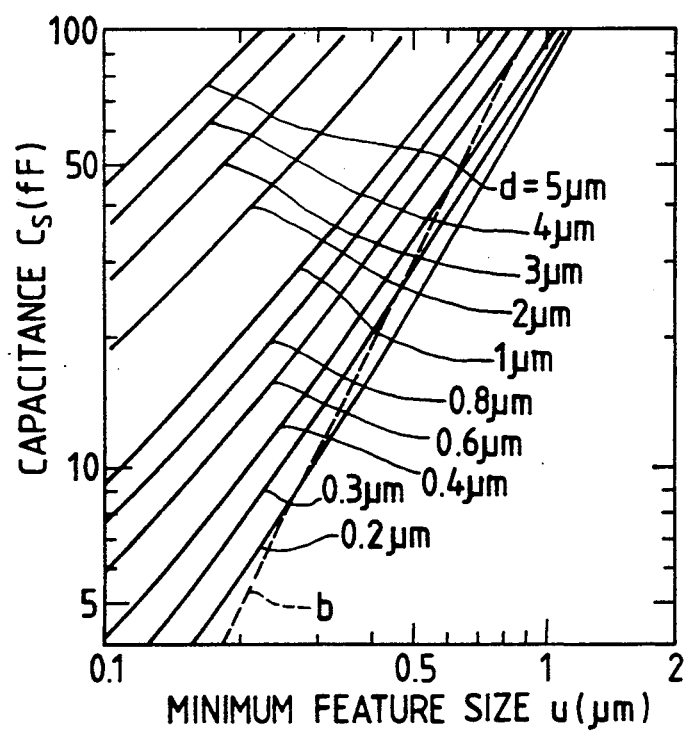

FIG. 4 shows the relationship between the minimum feature size u and the capacitance $C_s$ obtained by substituting the equation (4) into the equation (3). In the figure, the chain line b shows the relationship between the capacitance $C_s$ and the minimum feature size u in the case where the area of the top portion of the storage electrode is equal to that of the side wall portion thereof.

It will be understood from FIG. 4 that, if the thickness d of the storage electrode 10 is, for example, 0.5 μm or more, when the minimum feature size is 0.3 μm, the capacitance is 20 fF or more. When the minimum feature size is 0.5 μm, the capacitance is 40 fF or more. It will also be understood that, even if the thickness of the capacitor insulator is increased from 5 nm to 7 nm (in terms of the silicon dioxide equivalent), a capacitance of 30 fF or more can be ensured and a 16-megabit DRAM can readily be realized.

In either one of the arrangements shown in FIGS. 2 and 4, when the area of the side wall portion is larger than that of the top portion (i.e., in the region above the chain line), the capacitance of the capacitor decreases gently (i.e., the slope of the curve decreases) if the size is reduced (i.e., the minimum feature size u is reduced) with the thickness of the storage electrode being maintained at a constant level. The present invention is the first to realize such a region, which is also a region where the present invention is effective.

Figure 5:
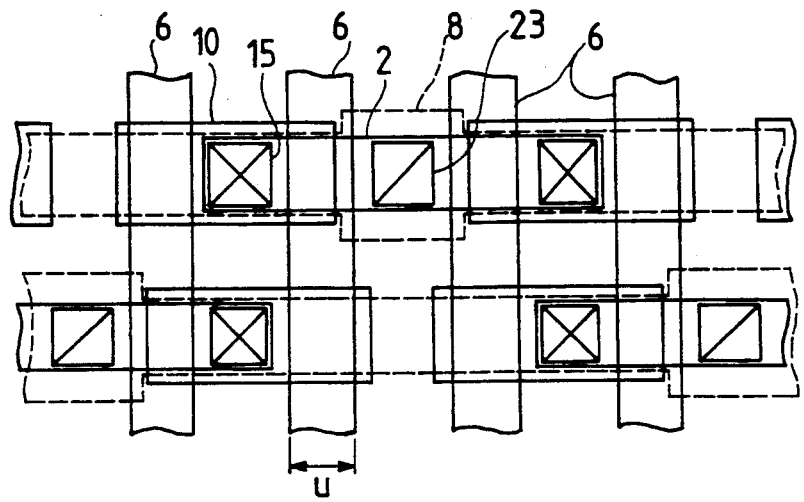
FIG. 5 is a plan view showing a layout of a conventional DRAM.

FIG. 5 shows one example of the planar layout of a DRAM having a known stacked capacitor in which the data line 8 is disposed above the capacitor. The size of the contact holes 15 and the like is set at the minimum feature size u in the same way as in FIG. 1. Assuming that the mask alignment accuracy is ½ of the minimum feature size u in the same way as in FIG. 1, the width of the storage electrode is 1.5 u. Since an alignment tolerance of ½ u is required at the contact hole 23 for the data line 8, the storage electrode 10 must keep away from it and therefore the length of the storage electrode 10 is 3.5 u. Accordingly, the surface area $S_c$ of the storage electrode may be approximated as being the sum of the area of the planar portion and the area of the side wall portion, as follows:

$$S_c = 5.25*u^2 + 10*a*u^2 \qquad (5)$$

Figure 6:
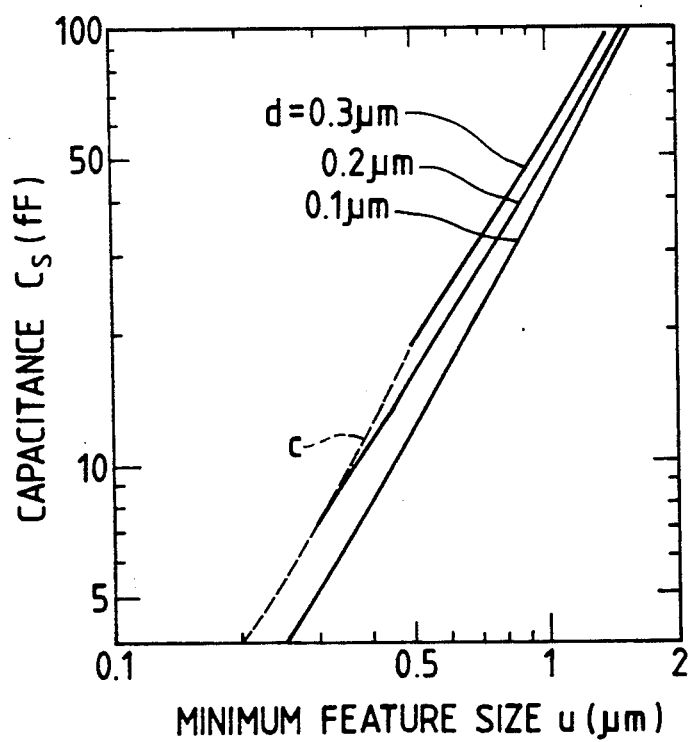
FIG. 6 is a graph showing the relationship between the capacitance and the minimum feature size in a conventional capacitor.

FIG. 6 shows the relationship between the minimum feature size u and the capacitance $C_s$ obtained by substituting the equation (5) into the equation (3). It should be noted that film thickness of the capacitor insulator is 5 nm. The chain line c shows the relationship between the capacitance $C_s$ and the minimum feature size u in the case where $\alpha = \frac{1}{2}$. It will be understood from FIG. 6 that, when the minimum feature size u decreases to 0.3 μm, even if the thickness of the storage electrode is set at 0.3 μm (which is the upper-limit value in the case where the data line is formed above the capacitor, as stated above), it is possible to obtain only a capacitance of 10 fF or less. With this value, the signal reversal due to alpha-particles cannot satisfactorily be prevented and it is therefore impossible to apply this capacitor, for example, to a 64-megabit DRAM.

According to the present invention, however, it is possible to obtain a capacitor having a sufficiently large capacitance even when the memory cell size decreases.

The present invention may be arranged as follows.

A groove may be formed in one of the electrodes constituting a capacitor which is formed below the other to serve as a storage electrode. The thickness of the storage electrode may be set so as to be greater than the minimum feature size of the storage electrode. The arrangement may be such that at least a part of the contact hole formed to electrically connect together the storage electrode and a conductive film or a doped region formed below the storage electrode is not covered with the electrode. Such said contact hole may be filled with a material which is different from the material employed to form the storage electrode. The capacitor insulator includes as at least a part thereof a stacked film comprising thermal silicon nitride formed by carrying out a heat treatment in an atmosphere containing nitrogen, silicon nitride formed by chemical vapor deposition (CVD), and silicon dioxide formed by thermal oxidation.

In the process for producing a semiconductor device, a silicon film which is employed to constitute each of the two electrodes of a capacitor is preferably formed by the use of a source gas containing disiline or trisilane as at least a part thereof and at a temperature of from 400° C. to 560° C.

The step of forming the storage electrode, that is, the lower one of the two electrodes, and the steps following it are preferably carried out at a temperature not higher than 850° C. It is also preferable to cool the silicon substrate to a temperature of from −200° C. to 0° C. when the storage electrode is formed by dry etching process. Processing of the storage electrode is preferably carried out after a side spacer has been formed on the side wall of the etching mask by self alignment. A conductive film may be selectively formed in the contact hole Optionally, a conductive film may be selectively formed in the contact hole by first forming a conductive film on the whole surface of the substrate and then etching the conductive film.

In the foregoing, the conductive film that constitutes the storage electrode is formed by chemical vapor deposition (CVD), which is most suitable for forming the storage electrode in the present invention.

EMBODIMENT 1

Figure 7:
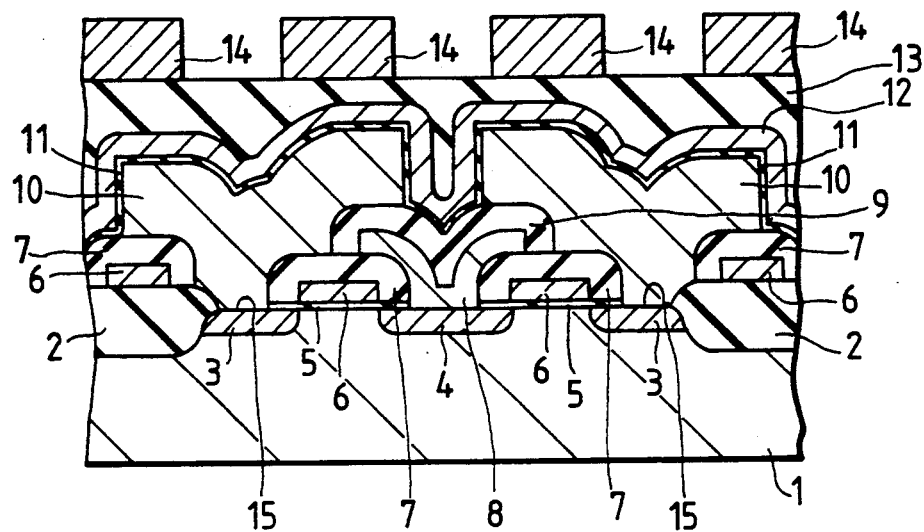
FIGS. 7 and 8 are sectional views of DRAMs respectively showing embodiments of the present invention.

FIG. 7 is a sectional view of a DRAM having a stacked capacitor, which shows one embodiment of the present invention. On a P-type mono-crystalline silicon substrate 1 having a resistivity of 10 Ω·cm are formed by the use of known techniques an insulator 2 for device isolation, MOS transistors each having a gate insulator 5, a source region 3, a drain region 4 and a word line 6 also serving as a gate electrode, an insulator 7, a data line 8, an insulator 9 and storage electrode contact holes 15. Next, a silicon film is formed to a thickness of 0.8 μm by low pressure CVD while doping phosphorus at a concentration of $1 \times 10^{20}$ cm$^{-3}$. After an etching mask has been formed by an ordinary lithography technique, the silicon film is processed by dry etching to form storage electrodes 10. In the processing, a μ-wave excitation dry etching apparatus was employed, SF$_6$ gas was used as a source gas and the temperature of the silicon substrate 1 was maintained at −110° C. As a result, the insulator 9 was only slightly etched and the storage electrodes 10 were also only slightly side-etched although over-etching was carried out for a long period of time in order to remove the silicon film from the side walls of the underlying steps. Next, a capacitor insulator 11 and a plate electrode 12 were formed to complete a capacitor. Thereafter, an insulator 13 and an interconnection layer 14 were formed by known methods to complete a DRAM. In this embodiment, a processing technique with a minimum feature size of 0.6 μm is employed and the memory cell area is 4.4 μm$^2$. The capacitance is 47 fF, which is a value adequate for a DRAM. If the thickness of the storage electrode 10 is further increased, the capacitance increases, as a matter of course. However, 5 μm is the upper-limit value for the thickness of the storage electrode 10. This is due to the following reasons. The selectivity between the silicon film processed by a μ-wave excitation dry etching apparatus to form the storage electrodes 10 and the silicon dioxide film constituting the insulator 9 is relatively high, but the value of the selectivity is on the order of 100. Accordingly, if the allowable amount of etching of the insulator 9 caused when 100% overetching is carried out is assumed to be 50 nm, the silicon film can be processed to a maximum thickness of 5 μm. It should be noted that, although in this embodiment processing is carried out at −110° C., if the processing temperature is lowered, the anisotropy is further improved. However, since saturation is substantially reached at −150° C., it is unnecessary to cool the system in excess of −200° C. at which cooling is effected relatively easily.

The following is a description of the points which should be kept in mind in production of the DRAM shown in this embodiment. In the capacitor of the present invention, the contribution of the side wall (or side surface) of the storage electrode 10 to the capacitance is extremely large and it is therefore important to ensure the reliability of the capacitor insulator 11 at the side wall of the storage electrode 10. However, if a silicon dioxide film obtained by thermal oxidation of the surface of the silicon film constituting the storage electrode 10 is employed as the capacitor insulator 11, problems related to reliability often arise. This is due to the following reasons. The storage electrode 10 contains impurities at high concentration and has already been made into a polycrystalline in the capacitor insulator forming step or during a heat treatment carried out in advance. Therefore, a large number of grain boundaries are present in the storage electrode 10 and, in addition, the side wall of the storage electrode 10 has been damaged and contaminated by dry etching. Accordingly, it is difficult to form an insulator which is superior in breakdown voltage and long-term reliability by using a silicon dioxide film obtained by thermal oxidation of the silicon film in an ordinary furnace. Under these circumstances, in the present invention the capacitor insulator 11 was formed in the manner described below. After the storage electrode 10 was formed, a heat treatment was carried out for 30 minutes in a HH$_3$ atmosphere at 850°

C. and under 1 atmospheric pressure, thereby forming a thin thermal silicon nitride film. Thereafter, a silicon nitride film of 3 nm thick was formed by low pressure CVD and then a silicon dioxide film was formed on the surface of the silicon nitride film by the use of steam oxidation carried out at 850° C., thus forming a capacitor insulator. The silicon dioxide equivalent thickness of the insulator obtained by capacitance measurement was 5 nm. By forming a capacitor insulator in this way, it is possible to prevent occurrence of various problems which would otherwise be experienced in the case of a single layer of silicon dioxide film formed by thermal oxidation, for example, the lowering in the film thickness controllability as a result of enhanced oxidation by phosphorus contained in the polycrystalline silicon film and deterioration of the film quality caused by phosphorus taken into the silicon dioxide film. Thus, it is possible to realize the advantages of the present invention even more effectively. It should be noted that favorable results were obtained in regard to silicon nitride and silicon dioxide films having various thicknesses (including those which were not subjected to the final thermal oxidation), $Ta_2O_5$ film, $Al_2O_3$ film and stacked films including these films. In addition, a thermal silicon nitride film or thermal silicon dioxide film formed within a short period of time by the use of a lamp also had excellent reliability.

A method of forming electrodes constituting a capacitor will next be explained. Silicon films used to form these electrodes were formed at 525° C. by the use of a source gas consisting essentially of disilane ($Si_2H_6$) and phosphine ($PH_3$). The feature of the silicon films thus formed to serve as the storage electrode 10 and the plate electrode 12 resides in that, when they are formed at a temperature of 525° C., the silicon films are substantially amorphous and not electrically conductive, but after being annealed at a temperature of not lower than 650° C., the silicon films show adequate electrical conductivity. Therefore, the storage electrode 10 has already obtained adequate electrical conductivity in the step of forming the capacitor insulator, and the plate electrode 12 is also able to obtain adequate electrical conductivity if a heat treatment is carried out at a temperature of not lower than 650° C. in any step after the formation of the silicon film. In the case where the data lines are formed in advance of the storage electrodes and the steps after the formation of the data lines must be carried out at as low a temperature as possible in order to achieve a reduction in the device size as in the case of this embodiment, formation of such amorphous silicon films is considerably effective. In particular, when a low temperature film forming technique or a substantially low temperature film forming technique, for example, rapid thermal annealing using a lamp, is employed to form a capacitor, the advantageous effect is further enhanced. It should be noted that the silicon films can be made amorphous even more effectively by lowering the temperature at which these films are formed. In such a case, however, the growth of film is relatively slow. This problem may be overcome by employing trisilane ($Si_3H_8$), which is more reactive than disilane. However, in such a case also, 400° C. is the lower limit in practical application.

EMBODIMENT 2

Figure 8:
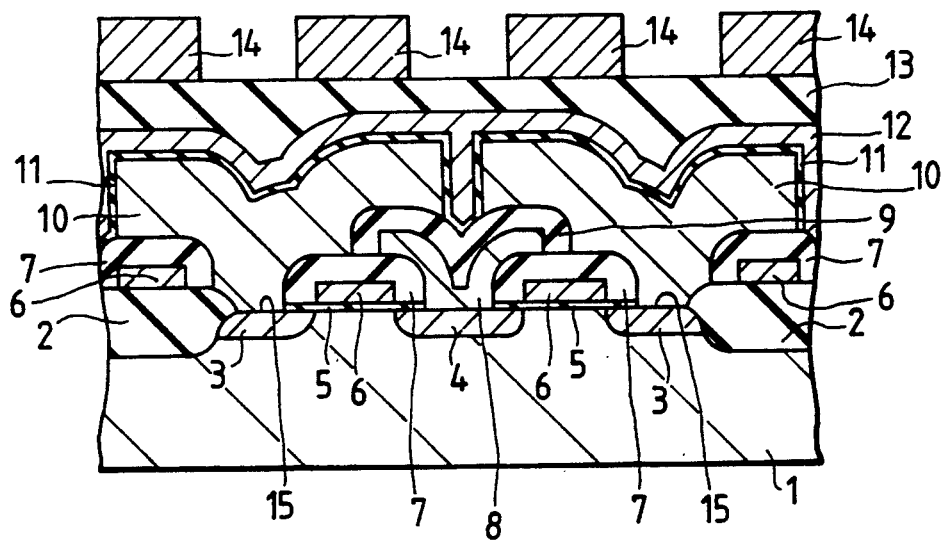

FIG. 8 is a fragmentary sectional view of a DRAM according to a second embodiment of the present invention. In this embodiment, after storage electrode contact holes 15 have been formed, a silicon film is formed to a thickness of 0.8 μm by low pressure CVD in the same way as in the first embodiment. Thereafter, an etching mask is formed by an ordinary lithography process. Then, a silicon dioxide film is formed by the use of plasma-enhanced CVD. The substrate temperature at this step is room temperature. Next, the silicon dioxide film is etched by the use of a known dry etching technique to form side spacer in self alignment with respect to the side wall of the etching mask. Thus, the opening is narrowed and the distance between each pair of adjacent storage electrodes can be made less than the minimum feature size. The distance between the storage electrodes after the processing was 0.3 μm. When the distance between the storage electrodes decreases as described above, it would be difficult in the prior art to effect doping when the plate electrode 12 is formed after the formation of the capacitor insulator 11 because the gap between each pair of adjacent storage electrodes is filled with the plate electrode 12. In this embodiment, however, the silicon film is formed while being subjected to doping to form the plate electrode 12 and there is therefore no problem of how to carry out doping. The same procedure as in the first embodiment was carried out except for the above to complete a DRAM. In this embodiment, the memory cell area is 4.4 μm$^2$ which is the same as in the first embodiment, whereas the capacitance is increased to 65 fF. This is because the area of the top portion (or top surface) of the storage electrode increases and the area of the side wall portion thereof also increases, as described above.

EMBODIMENT 3

Figure 9:
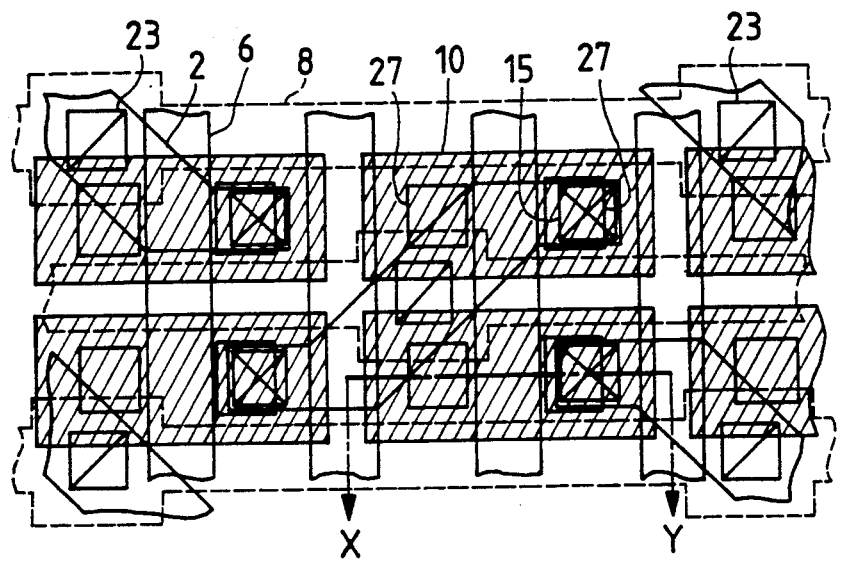
Figure 10:
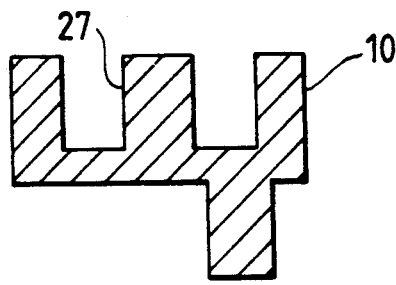
FIG. 10 is a sectional view showing a part of one example of a capacitor electrode in the present invention.

FIG. 9 shows the planar layout of a DRAM according to a third embodiment of the present invention. The method of producing this DRAM will be explained below. After the storage electrodes 10 were formed in the same way as in the second embodiment, an etching mask having openings at positions respectively corresponding to grooves 27 was formed and then the storage electrodes 10 were etched again. The etching was finished before the silicon film constituting the storage electrodes 10 was gone. FIG. 10 schematically shows the section of the storage electrode 10 at the position shown by X and Y in FIG. 9. The effect of the step portions of the ground is not shown in the figure. Thereafter, the steps after the capacitor insulator forming step were carried out in the same way as in the second embodiment to complete a DRAM. A capacitance of 79 fF, which was 1.7 times that in the first embodiment, was obtained.

EMBODIMENT 4

Figure 11:
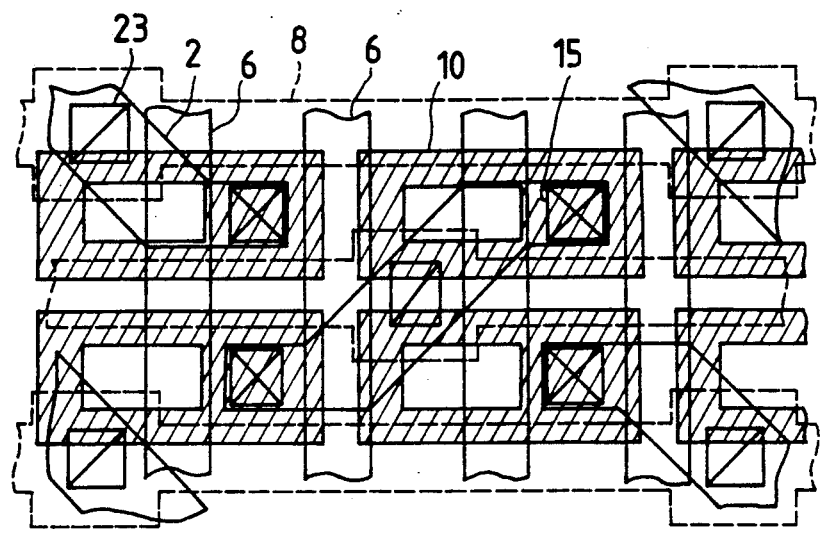

FIG. 11 shows the planar layout of a DRAM according to a fourth embodiment of the present invention. The process for producing the DRAM will next be explained. After a silicon film used to form storage electrodes 10 was formed in the same way as in the first embodiment, an etching mask was formed by the use of an electron beam exposure system. The resolution of the electron beam exposure system was 0.2 μm and it was possible to form a pattern substantially faithfully to that shown by the hatched lines in FIG. 11. Thereafter, the step of processing the silicon film and the steps following it were carried out in the same way as in the second embodiment to complete a DRAM. A capacitance of 74 fF, which was 1.6 times that in the first embodiment, was obtained.

EMBODIMENT 5

Figure 12:
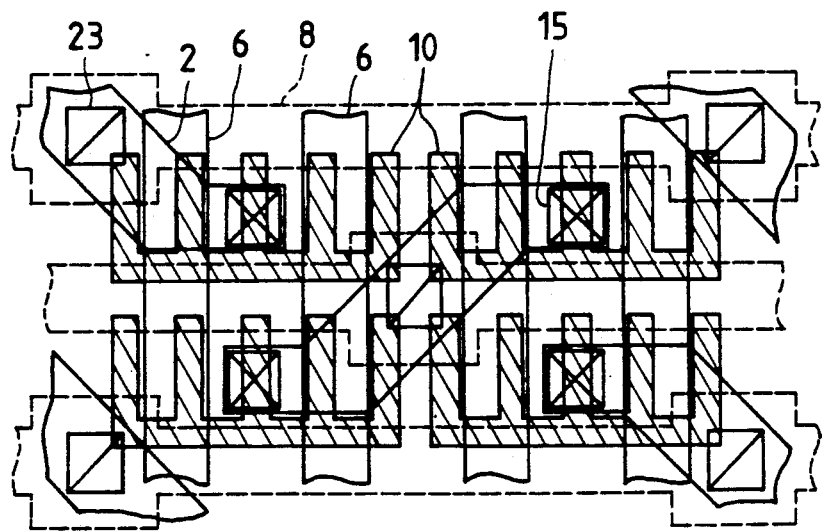

FIG. 12 shows the planar layout of a DRAM according to a fifth embodiment of the present invention. The process for producing the DRAM will next be explained. The steps were carried out in the same way as in the first embodiment up to the step of forming the storage electrode contact holes 15. Then, tungsten was selectively grown in the contact holes 15 by the use of CVD to fill the contact holes 15. Thereafter, the step of processing the silicon film and the steps following it were carried out in the same way as in the fourth embodiment to complete a DRAM. In this embodiment, the contact holes 15 were filled with a material (tungsten) which is not substantially etched when the silicon film constituting the storage electrodes 10 was processed. Therefore, there is no problem if the storage electrode contact holes 15 are exposed, as shown in FIG. 12. As a result, it becomes possible to adopt a layout in which the side wall of each storage electrode 10 is elongated, as shown in FIG. 12, and thus the advantageous effect obtained by increasing the thickness of the storage electrode 10, which is the main point of the present invention, can be fully exhibited. In this embodiment, a capacitance of 89 fF, which was nearly double that in the first embodiment, was obtained. It should be noted that the present invention was also effective in the case where the contact holes 15 were filled with tungsten by, in place of the selective growth, first forming tungsten on the whole surface by CVD and then etching the whole surface such that the tungsten was removed from the planar portion but left only within the storage electrode contact holes 15. The contact holes 15 may be filled with a material other than tungsten, for example, molybdenum, tantalum, a silicide thereof or a stacked film of these materials.

As has been described above, the present invention enables a capacitor with a large capacitance to be formed without the need to reduce the thickness of the capacitor insulator and therefore permits a great increase in the integration density of LSIs, particularly DRAMs.

EMBODIMENT 6

FIG. 13 is a sectional view of a DRAM having a stacked capacitor according to a sixth embodiment of the present invention.

Figure 13A:
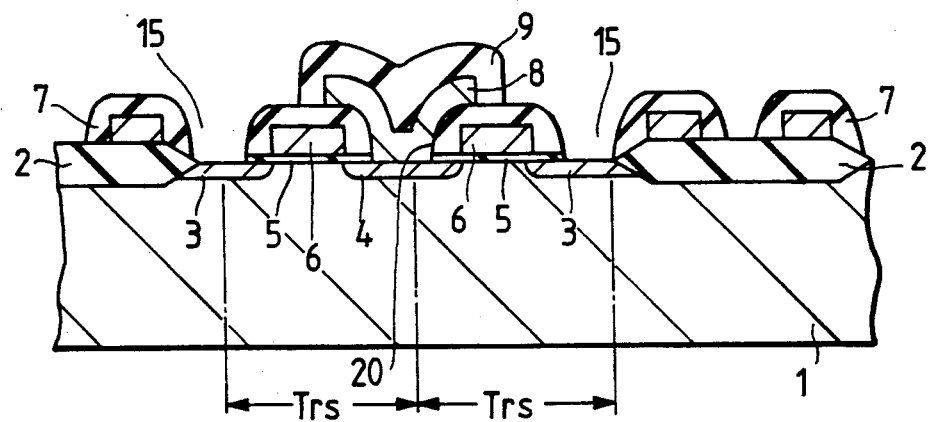
FIGS. 13(a), 13(b), 13(c), 13(d), 15, 16, 17 and 19 are sectional views showing the steps of the process for producing DRAMs according to embodiments of the present invention.

First, as shown in FIG. 13(a), MOS transistors or MOSFETs (which may also be referred to as insulated-gate field-effect transistors or IGFETs) each comprising source and drain doped regions 3 and 4, a gate insulator 5 and a gate electrode (word line) 6, a data line 8, an insulator 9 and contact holes 15 are formed on a P-type mono-crystalline silicon substrate 1 having a resistivity of 10 Ω·cm by the use of known techniques.

Figure 13B:
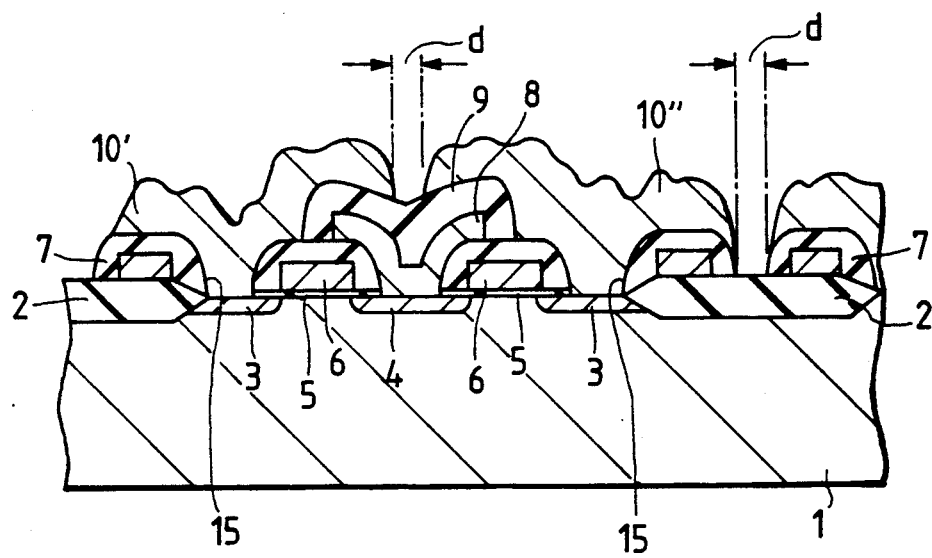

Next, as shown in FIG. 13(b), a silicon film is selectively grown in the contact holes 15 to a thickness of about 0.5 μm by the following selective CVD to form storage electrodes 10. In this embodiment, it was possible to set the distance d between each pair of adjacent storage electrodes 10' and 10" to 0.15 μm. More specifically, in this embodiment the storage electrodes 10 were formed in the manner described below. After the step shown in FIG. 13(a), the silicon substrate was precleaned with HF liquid and then set in a known CVD reaction vessel. Then, with the substrate temperature set at 800° C., $H_2$, $SiH_2Cl_2$, $PH_3$ and HCl gases were supplied to the reaction vessel to selectively grow a silicon film to about 0.5 μm.

It is important to accurately set the distance d between each pair of adjacent storage electrodes 10' and 10". In the present invention, the distance d can be set readily and considerably accurately by properly setting the substrate temperature and the growth time, which are conditions for the selective growth of silicon film. More specifically, in the early stage of the growth no silicon film is grown on either of the insulator 7 and 9 but are selectively grown only on the doped regions 3 exposed through the contact holes 15 and, as the growth progresses, the silicon films grown on the doped regions 3 gradually extend onto the insulator 7 and 9 and eventually reach the respective positions where a predetermined distance between the adjacent storage electrodes 10' and 10" is obtained.

It should be noted that it is also possible to effect selective growth of silicon film by supplying $Si_2H_6$ and $H_2$ or $N_2$ to the reaction vessel under conditions that the substrate temperature is in the range of from 900° C. to 1,000° C. and the pressure inside the reaction vessel is 1 atmospheric pressure or lower.

Selective growth of selicon film may also be effected by using $Si_3H_8$ which is more reactive than $Si_2H_6$.

Figure 13C:
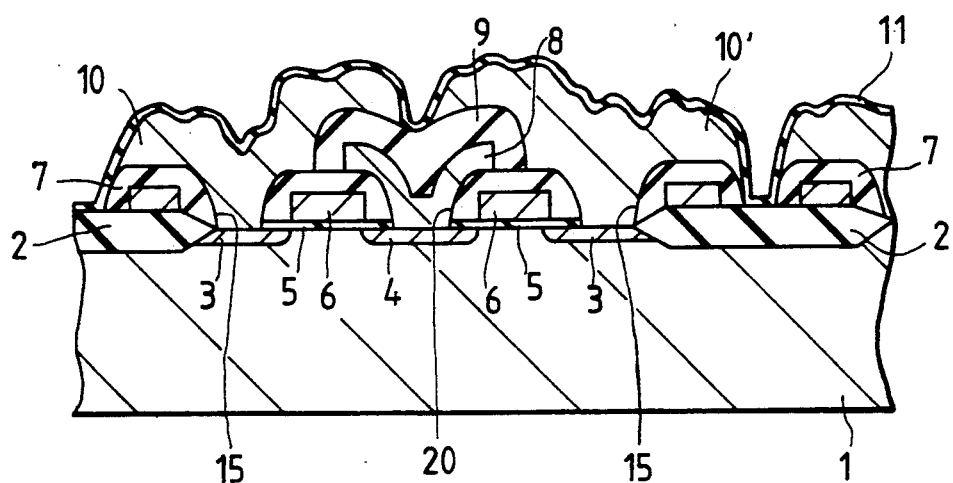

Next, as shown in FIG. 13(c), a capacitor insulator 11 is formed over the storage electrodes 10. In this embodiment, the capacitor insulator 11 is formed in the manner described below.

First, a heat treatment is carried out for 20 minutes in a $NH_3$ atmosphere at 900° C. and under 1 atmospheric pressure, thereby forming a thin thermal silicon nitride film. Thereafter, a silicon nitride film of about 4 nm thick is formed by low pressure CVD and then a silicon dioxide film is formed on the surface of the silicon nitride film by the use of steam oxidation carried out at 900° C., thus completing formation of a capacitor insulator 11 having a predetermined film thickness.

The silicon dioxide equivalent thickness of the capacitor insulator 11 obtained by capacitance measurement was 7 nm. It should be noted that favorable results were obtained in regard to silicon nitride and silicon dioxide films having various thicknesses (including those which were not subjected to the final thermal oxidation), $Ta_2O_5$ film, $Al_2O_3$ film and stacked films including these films.

In addition, a thermal silicon nitride film or thermal silicon dioxide film formed within a short period of time by the use of a lamp also had excellent reliability.

Figure 13D:
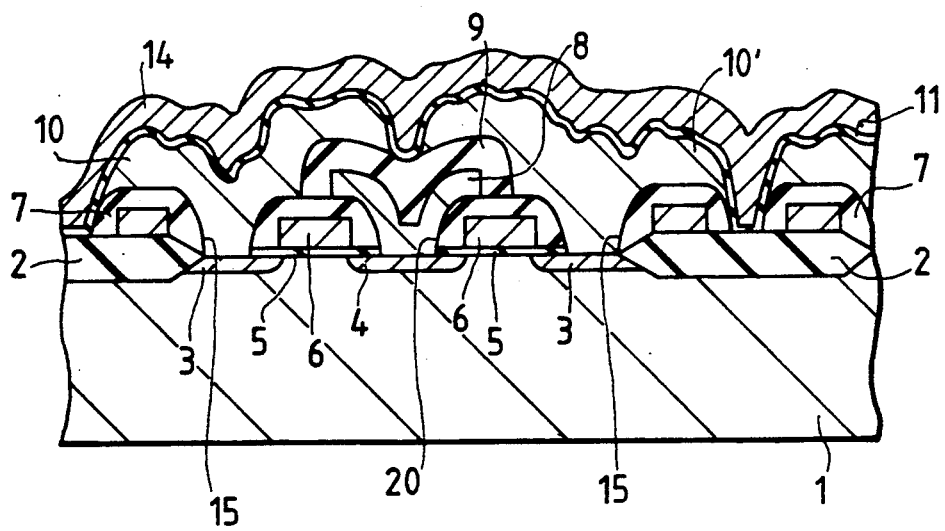

Finally, as shown in FIG. 13(d), a silicon film is formed to a thickness of about 0.3 μm by low pressure CVD while being doped with phosphorus to form a plate electrode 12.

Thereafter, contact holes which are opened in the plate electrode 12 are provided at the periphery of the memory array according to the need to lead out the data and word lines 8 and 6 on the upper side of the plate electrode 12 so as to be connected with a peripheral circuit, thus completing a semiconductor memory according to the present invention. It should be noted that, although in this embodiment a doped silicon film is employed to form the plate electrode 12, it is also possible to employ other materials, for example, low-resistance metals such as Al, Au, etc., refractory metals such as W, Mo, etc., silicides thereof, or stacked films of these materials.

Figure 14:
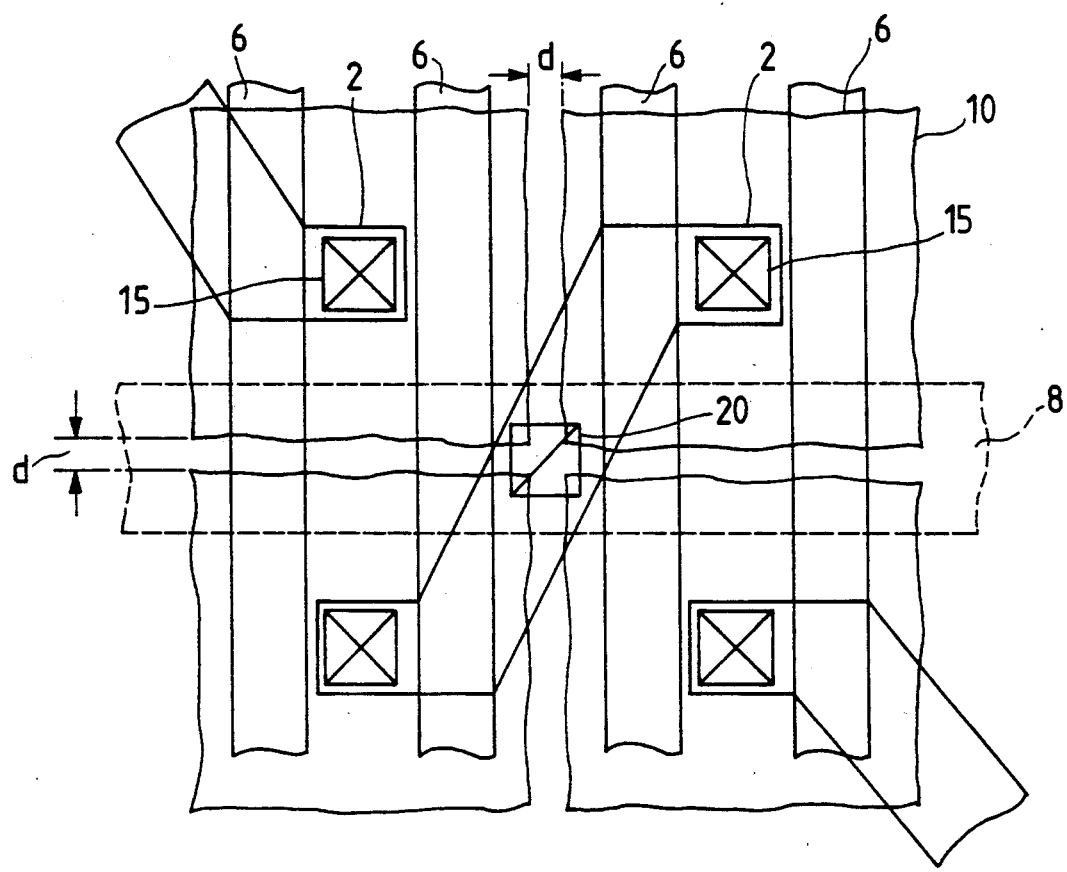
FIG. 14 is a plan view showing the layout of the DRAM shown in FIG. 13(b)

FIG. 14 shows the planar layout of the semiconductor memory having the cross-sectional structure shown in FIG. 13(d). The positional relationship between the electrodes, interconnections and contact holes will become clear by making cross reference to FIGS. 13(d) and 14. The reference numeral 20 denotes a contact hole for electrical connection between the data line and the doped region. The plate electrode 12 (not shown) is disposed on the capacitor insulator 11 (not shown) on the whole surface of this structure which is parallel to the surface of the sheet of this figure.

EMBODIMENT 7

A seventh embodiment will next be explained with reference to FIG. 13.

As shown in FIG. 13(a), MOS transistors Trs, data lines 8, an insulator 9 and contact holes 15 are formed on a P-type silicon substrate 1 having a resistivity of 10 $\Omega$·cm by the use of known techniques in the same way as in the sixth embodiment.

Next, as shown in FIG. 13(b), silicon films are selectively grown to a thickness of about 0.5 $\mu$m from the bottoms of the contact holes 15 to form storage electrodes 10 (having an insular configuration according to the layout shown in FIG. 14).

In this embodiment, the storage electrodes 10 were formed as follows. It was possible to selectively grow a low-resistance silicon film by introducing SiH$_2$Cl$_2$, HCl and H$_2$ gases, together with PH$_3$ gas, into a reaction vessel with the substrate temperature being maintained at 780° C. It should be noted that, although in this embodiment PH$_3$ was employed as a doping gas, it is also possible to employ other impurity source gases, for example, B$_2$H$_6$, AsH$_3$, etc. It was also possible to obtain a low-resistance silicon film by introducing Si$_2$H$_6$, and H$_2$ or N$_2$, together with PH$_3$ gas, into the reaction vessel under conditions that the substrate temperature was 920° C. and the pressure inside the reaction vessel was 1 atmospheric pressure or less.

In this case also, Si$_3$H$_8$ may be employed in place of Si$_2$H$_6$, and B$_2$H$_6$ or AsH$_3$ gas may be employed as a doping gas to obtain results similar to those described above.

Next, as shown in FIG. 13(c), after the storage electrodes 10 have been formed, the atmosphere inside the same reaction vessel is replaced with N$_2$ and the wafer temperature is maintained at 900° C. Next, NH$_3$ is introduced into the reaction vessel in place of N$_2$ to carry out thermal nitriding for 20 minutes in the NH$_3$ atmosphere. The thermal silicon nitride film thus formed constitutes the lowermost layer of the capacitor insulator. Thereafter, a silicon nitride film is formed by low pressure CVD and a silicon dioxide film is formed on the surface of the silicon nitride film by the use of steam oxidation carried out at 900° C. The silicon oxide equivalent thickness of the capacitor insulator 11 obtained by capacitance measurement was extremely small, i.e., 5 nm, and, at the same time, the capacitor insulator 11 showed breakdown voltage characteristics applicable to 16-megabit DRAMs. In general, a silicon film doped with an impurity at high concentration has a natural silicon dioxide film of 1 to 2 nm thick present on the surface thereof. If this natural silicon dioxide film is subjected to thermal nitridation in an HN$_3$ atmosphere, it is formed into an oxynitride film, so that the dielectric constant of the film increases to about 4.5~5.5 from about 3.8 of SiO$_2$. However, a complete silicon nitride film cannot be obtained within the actual working range, i.e., 950° C. or less.

According to this embodiment, after the formation of the storage electrodes 10, the surfaces thereof are not exposed to the oxygen atmosphere and, in this state, a thermal silicon nitride film is formed on the surfaces of the storage electrodes 10. It is therefore possible to obtain a substantially complete silicon nitride film. In addition, since the film contains no oxygen, it has superior oxidation resistance and therefore can serve as a barrier when the surface of the silicon nitride film is oxidized, thus preventing abnormal oxidation of the substrate silicon film.

According to the present invention, it is possible to form the capacitor insulator 11 on the surfaces of the storage electrodes 10 without exposing these surfaces to the oxygen atmosphere after the formation of the storage electrodes 10. It is therefore possible to form an extremely thin insulator, i.e., on the order to 5 nm, with excellent controllability. Since the step of forming the plate electrode 12 carried out thereafter is the same as the step shown in FIG. (d) according to the sixth embodiment, description thereof is omitted.

EMBODIMENT 8

An eighth embodiment of the present invention will next be explained with reference to FIGS. 13(a), 15 and 16.

First, as shown in FIG. 13(a), MOS transistors Trs, data lines 8, an insulator 9 and contact holes 15 are formed on a P-type silicon substrate 1 having a resistivity of 10 $\Omega$·cm by the use of known techniques.

Figure 15:
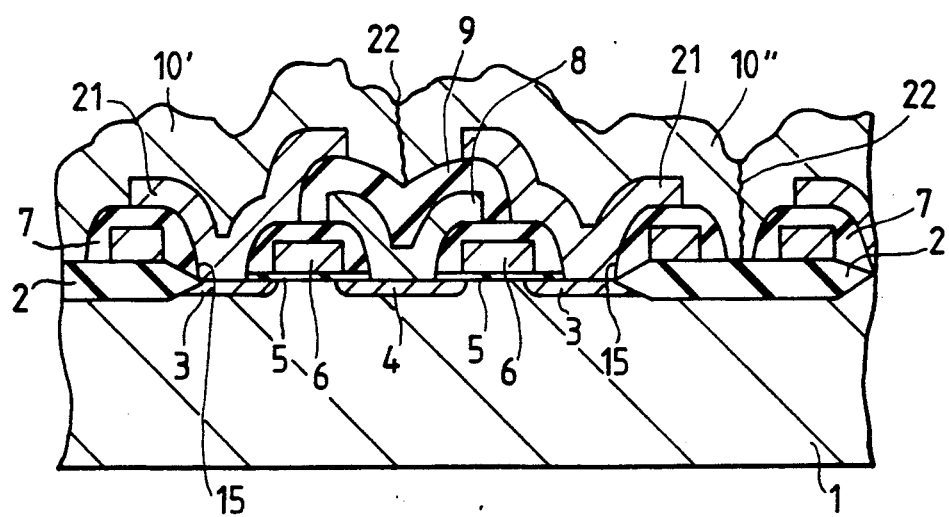

Next, as shown in FIG. 15, a silicon film is formed to a thickness of 0.3 $\mu$m by low pressure CVD while being doped with phosphorus in the same way as in the seventh embodiment. After an etching mask has been formed by an ordinary method, the silicon film is processed by plasma-enhanced etching process to form conductor films 21. Next, silicon films which are used to form storage electrodes 10 are formed over the conductive films 21 by selective CVD by the method shown in the seventh embodiment. At this time, the silicon films are grown until each pair of adjacent storage electrodes 10' and 10" comes into contact with each other at a storage electrode contact portion 22.

Figure 16:
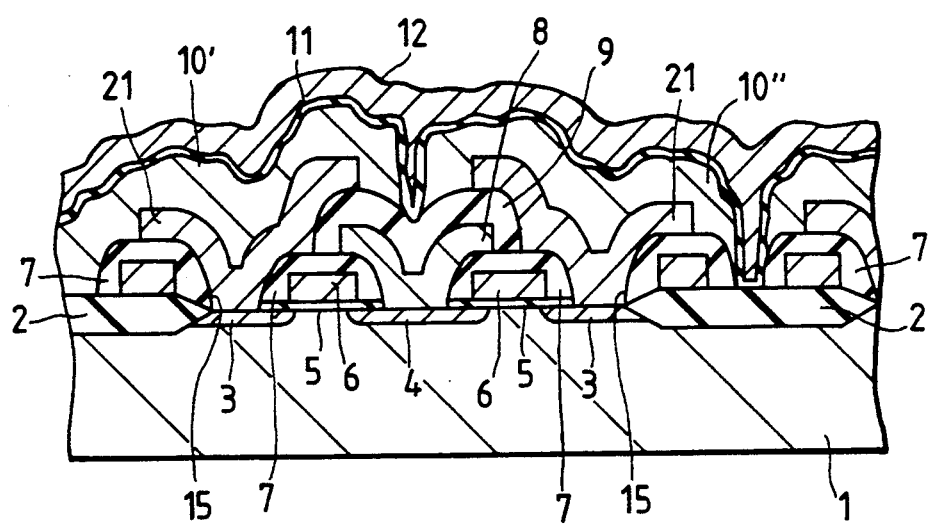

Next, as shown in FIG. 16, the storage electrodes 10 are subjected to wet etching with a mixed liquid of HF and HNO$_3$.

Since the storage electrode contact portion 22 is a region where the silicon films are in contact with each other discontinuously, the wet etching rate at the contact portion 22 is several times higher than that at the planar portion. Accordingly, by effecting overetching until the surface of the insulator 9 is exposed, the portion of contact between each pair of adjacent storage electrodes 10 disappears and a narrow and deep etched area is formed therebetween.

In this embodiment, it was possible to reduce the distance between each pair of storage electrodes 10' and 10" to 0.1 $\mu$m. In addition, since it is possible to increase the film thickness of the storage electrodes 10, as illustrated, the whole side wall surface having a relatively large area which is formed as a result of etching of the contact portion 22 can effectively be utilized as an electrode surface. Thus, in this embodiment it was possible to further increase the capacitor area. Since the steps of forming a capacitor insulator 11 and a plate electrode 12, which are carried out thereafter, are similar to those shown in FIGS. 13(c) and 13(d) in the sixth embodiment, description thereof is omitted.

EMBODIMENT 9

A ninth embodiment of the present invention will next be explained with reference to FIGS. 13(a), 17, 18 and 19.

First, as shown in FIG. 13(a), MOS transistors Trs, data lines 8, an insulator 9 and contact holes 15 are formed on a P-type silicon substrate 1 having a resistivity of 10 Ω·cm by the use of known techniques.

Figure 17:
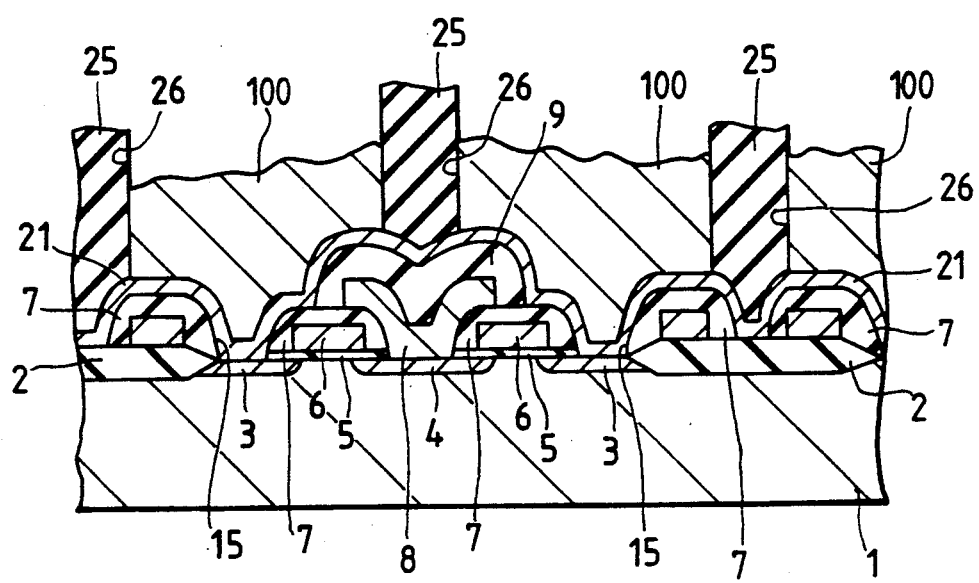
Figure 18:
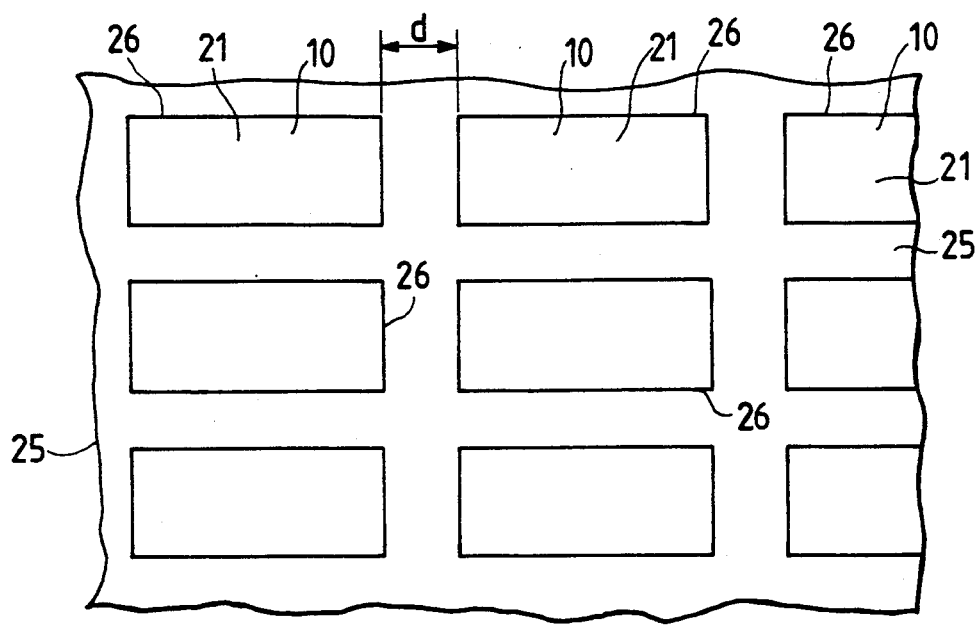
FIG. 18 is a plan view showing an essential part of the DRAM shown in FIG. 17.

Next, as shown in FIG. 17, a silicon film 21 is formed to a thickness of 0.15 μm on the whole surface of the substrate by low pressure CVD while being doped with phosphorus. Next, a thick $SiO_2$ film 25 is formed to a thickness of 1.0 μm on the silicon film 21 by CVD. After an etching mask has been formed by an ordinary method, the $SiO_2$ film 25 is patterned by dry etching to form openings 26, thereby exposing the surface of the silicon film 21 through the openings 26, as shown in FIG. 18 which is a plan view of the structure shown in FIG. 17. In this embodiment, it was possible to reduce the distance d between each pair of predetermined regions for forming storage electrodes 10 to 0.1 μm by thinning the remaining insulating films 25 by wet etching. Then, a silicon film 100 which is used to constitute a part of each storage electrode 10 is formed to a thickness of 0.7 μm from the conductive film 21 by selective CVD in the manner shown in the seventh embodiment.

Figure 19:
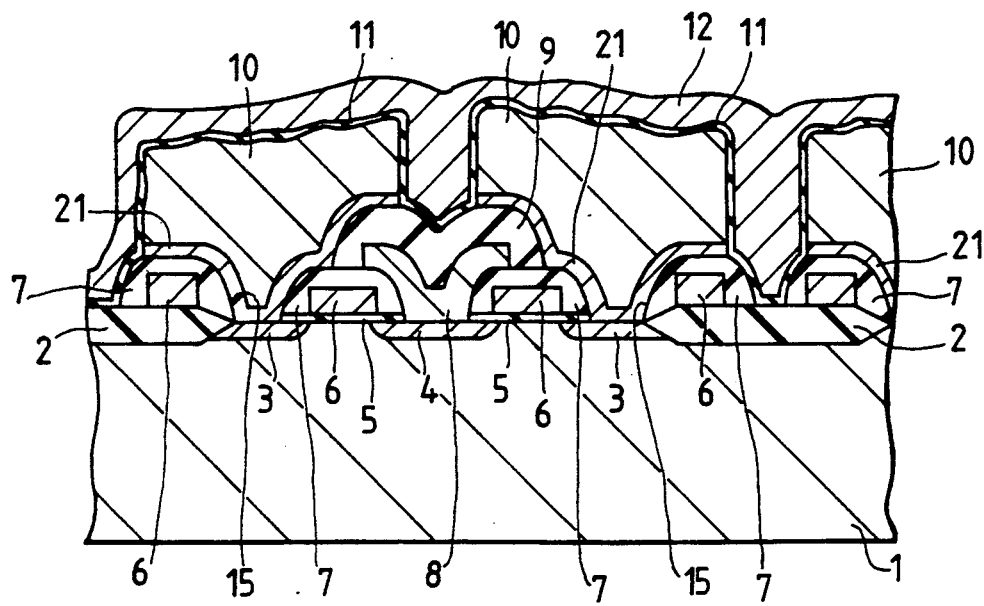

Next, as shown in FIG. 19, the remaining $SiO_2$ films 25 constituting the frames for the storage electrodes 10 are removed by wet etching to expose the surface of the conductive film 21. Thereafter, the exposed portions of the conductive film 21 are removed by anisotropic etching and storage electrodes 10 are formed.

Thereafter, a capacitor insulator 11 and a plate electrode 12 are formed in the same way as in the steps of the sixth embodiment which are respectively shown in FIGS. 13(c) and 13(d). According to this embodiment, the film thickness of each storage electrode 10 can be increased within the frame defined by the insulating film 25 and, as a result, it is possible to increase the area of the side wall portion of the storage electrode 10. Accordingly, even if the device size is reduced, the effective electrode area of the storage electrode 10 can be substantially enlarged, so that it is possible to ensure an adequate capacitance.

As has been described above, the present invention enables formation of a capacitor with a large capacitance by enlarging the effective area of the storage electrode without the need to reduce excessively the thickness of the capacitor insulator. Thus, it is possible to greatly increase the integration density of LSIs, particularly DRAMs.

In the present invention, it is possible to employ various kinds of insulating film as the capacitor insulator, for example, $SiO_2$ film, a stacked film comprising $SiO_2$ and $Si_3N_4$ films, a $Ta_2O_5$ film and a stacked film comprising a $Ta_2O_5$ film and $SiO_2$ and/or $Si_3N_4$ film. It is, of course, possible to further increase the capacitance by employing these dielectric materials having high dielectric constant.

As a material for the storage electrode, it is most advantageous to employ a polycrystalline silicon film, whereas, as a material for the plate electrode formed on the capacitor insulator, it is possible to employ a refractory metal, e.g., W, and a silicide of a refractory metal, in addition to polycrystalline silicon.

What is claimed is as follows:

1. A semiconductor device comprising:

at least one insulated-gate field-effect transistor (IGFET) each one thereof comprising a pair of spaced-apart impurity doped regions from a plurality of impurity doped regions formed at a predetermined spacing within a surface region of a semiconductor substrate having a first conductivity type, said doped regions having a second conductivity type, and a gate electrode including a first conductive film formed through a first insulator on the surface of said semiconductor substrate between a corresponding pair of impurity doped regions;

a second insulator formed on upper and side surfaces of said gate electrode;

a data line comprising a second conductive film electrically connected to a first of said pair of impurity doped regions and extending to the upper surface of said gate electrode along an outer surface of said second insulator; and at least one storage capacitor each one thereof comprising a first electrode including a third conductive film electrically connected to the second of said pair of impurity doped regions through an opening provided in an insulator formed on said second impurity doped region, said third conductive film having a thickness greater than the radius of said opening and extending to an upper surface of said data line along the outer surface of said second insulator and an outer surface of a third insulator formed so as to insulate said data line, a dielectric film formed continuously over top and side surfaces of said first electrode, and a second electrode including a fourth conductive film stacked over said dielectric film, wherein each IGFET of said at least one IGFET is electrically connected at the first one of a corresponding pair of impurity doped regions thereof to a respective one of a plurality of data lines disposed, at a regular interval, substantially in parallel and which are substantially straight-line directioned, wherein the gate electrode of each said IGFET is correspondingly associated with one of a plurality of word lines disposed, at a regular interval, substantially in parallel and which are substantially straight-line directioned crossing said plurality of data lines substantially at a right angle, wherein each IGFET is defined by an active region, surrounded by an isolating insulating film, which includes a channel forming portion defining a channel length direction which is not in parallel to the direction of said data lines, wherein the first region of said pair of impurity doped regions in each of said at least one IGFET is formed so as to orthogonally underlie, with respect to a plan view thereof, the data line electrically connected therewith, and wherein, in the plan view arrangement thereof, the second impurity doped regions of IGFETs of said at least one IGFET corresponding to the same word line are disposed in an arrangement in which adjacent pairs of second impurity doped regions thereof have respectively interposed between them the second impurity doped regions of IGFETs adjacent thereto corresponding to ones of an adjacent word line, the second impurity doped regions of said IGFETs of adjacent word lines are disposed so as to effect a substantially straight-line arrangement thereof and which straight-line arrangement is substantially in parallel to the direction of said word lines.

2. A semiconductor device according to claim 1, wherein the capacitance of said storage capacitor effected by a portion of said first electrode at the side surface thereof and those portions of said dielectric film and said second electrode which are formed over the side surface of said first electrode is greater than the capacitance of said storage capacitor effected by the top surface of said first electrode and those portions of said dielectric film and said second electrode which are formed over the top surface of said first electrode.

3. A semiconductor device according to claim 1, wherein the film thickness of said first electrode is from 0.4 to 5 μm.

4. A semiconductor device according to claim 1, wherein said first electrode is made of polycrystalline silicon.

5. A semiconductor device according to claim 1, wherein said first and second conductivity types are the p-type and the n-type, respectively.

6. A semiconductor device according to claim 1, wherein said dielectric film is made of $SiO_2$.

7. A semiconductor device according to claim 1, wherein said dielectric film is a stacked film comprising a $SiO_2$ film and a $Si_3N_4$ film.

8. A semiconductor device according to claim 1, wherein said dielectric film is a stacked film comprising at least two selected from the group consisting of a $Ta_2O_5$ film, a $SiO_2$ film and a $Si_3N_4$ film.

9. A semiconductor device according to claim 1, wherein said second electrode is made of a material selected from the group consisting of polycrystalline silicon, a refractory metal and a silicide of a refractory metal.

10. A semiconductor device according to claim 2, wherein the film thickness of said first electrode is from 0.4 to 5 μm.

11. A semiconductor device according to claim 10, wherein said first electrode is made of polycrystalline silicon.

12. A semiconductor device according to claim 11, wherein said first and second conductivity types are the p-type and the n-type, respectively.

13. A semiconductor device according to claim 12, wherein said dielectric film is made of $SiO_2$.

14. A semiconductor device according to claim 12, wherein said dielectric film is a stacked film comprising a $SiO_2$ film and a $Si_3N_4$ film.

15. A semiconductor device according to claim 12, wherein said dielectric film is a stacked film comprising at least two selected from the group consisting of a $Ta_2O_5$ film, a $SiO_2$ film and a $Si_3N_4$ film.

16. A semiconductor device according to claim 10, wherein said second electrode is made of a material selected from the group consisting of polycrystalline silicon, a refractory metal and a silicide of a refractory metal.

17. A semiconductor device according to claim 13, wherein said second electrode is made of a material selected from the group consisting of polycrystalline silicon, a refractory metal and a silicide of a refractory metal.

18. A semiconductor device according to claim 14, wherein said second electrode is made of a material selected from the group consisting of polycrystalline silicon, a refractory metal and a silicide of a refractory metal.

19. A semiconductor device according to claim 15, wherein said second electrode is made of a material selected from the group consisting of polycrystalline silicon, a refractory metal and a silicide of a refractory metal.

20. A semiconductor device according to claim 10, wherein said channel forming portion of each one of said at least one IGFET is arranged in a direction defined by an angle of about 45° with respect to the corresponding data line thereof.

21. A semiconductor device according to claim 10, wherein the first region of each pair of spaced-apart impurity doped regions is common to a pair of IGFETs of adjacent memory cells defined by a common data line and gate electrodes corresponding to adjacent word lines, and wherein each memory cell includes an IGFET of said at least one IFGETs and a respective storage capacitor of said at least one storage capacitor.

22. A semiconductor device according to claim 21, wherein said pair of IGFETs are defined by first and second channel forming portions, respectively extending on opposite directions from the common first impurity doped region thereof to the respective second impurity doped region thereof and which directions are defined by an angle of nearly 45° with respect to the direction of the corresponding data line thereof.

23. A semiconductor device according to claim 22, wherein with respect to each data line, the channel forming portions of the respective pairs of IGFETs coupled thereto, at the corresponding common first impurity doped regions thereof, are arranged so as to be directioned substantially in parallel.

24. A semiconductor device according to claim 22, wherein the channel forming portions of the respective pairs of IGFETs coupled to every other data line of said plurality of data lines are arranged so as to be directioned substantially in parallel and substantially in a right angle relationship to the direction of the channel forming portions of the pairs of IGFETs coupled to the respective adjacent lines thereof.

25. A semiconductor device according to claim 24, wherein the first and second regions of said pair of spaced-apart impurity doped regions are drain and source regions, respectively.

26. A semiconductor device according to claim 1, wherein said channel forming portion of each one of said at least one IGFET is arranged in a direction defined by an angle of about 45° with respect to the corresponding data line thereof.

27. A semiconductor device according to claim 1, wherein the first region of each pair of spaced-apart impurity doped regions is common to a pair of IGFETs of adjacent memory cells defined by a common data line and gate electrodes corresponding to adjacent word lines, and wherein each memory cell includes an IGFET of said at least one IGFETs and a respective storage capacitor of said at least one storage capacitor.

28. A semiconductor device according to claim 27, wherein said pair of IGFETs are defined by first and second channel forming portions, respectively extending on opposite directions from the common first impurity doped region thereof to the respective second impurity doped region thereof and which directions are defined by an angle of nearly 45° with respect to the direction of the corresponding data line thereof.

29. A semiconductor device according to claim 28, wherein with respect to each data line, the channel forming portions of the respective pairs of IGFETs coupled thereto, at the corresponding common first impurity doped regions thereof, are arranged so as to be directioned substantially in parallel.

30. A semiconductor device according to claim 28, wherein the channel forming portions of the respective pairs of IGFETs coupled to every other data line of said plurality of data lines are arranged so as to be directioned substantially in parallel and substantially in a right angle relationship to the direction of the channel forming portions of the pairs of IGFETs coupled to the respective adjacent data lines thereof.

31. A semiconductor device according to claim 30, wherein the first and second regions of said pair of spaced-apart impurity doped regions are drain and source regions, respectively.

32. A semiconductor device according to claim 29, wherein the first and second regions of said pair of spaced-apart impurity doped regions are drain and source regions, respectively.

33. A semiconductor device according to claim 32, wherein said first and second conductivity types are p-type and n-type, respectively.

34. A semiconductor device according to claim 30, wherein said first and second conductivity types are p-type and n-type, respectively.

35. A semiconductor device according to claim 1, wherein the insulator which is formed on the first impurity doped region of each one of said at least one IGFET and having an opening therethrough includes said first and second insulators.

36. A semiconductor device according to claim 1, wherein the insulator which is formed on the first impurity doped region of each one of said at least one IGFET and having an opening therethrough includes a fourth insulator.

37. A semiconductor device according to claim 16, wherein the insulator which is formed on the first impurity doped region of each one of said at least one IGFET and having an opening therethrough includes said first and second insulators.

38. A semiconductor device according to claim 16, wherein the insulator which is formed on the first impurity doped region of each one of said at least one IGFET and having an opening therethrough includes a fourth insulator.

39. A semiconductor device according to claim 36, wherein the insulator which is formed on the first impurity doped region of each one of said at least one IGFET and having an opening therethrough includes said first and second insulators.

40. A semiconductor device according to claim 31, wherein the insulator which is formed on the first impurity doped region of each one of said at least one IGFET and having an opening therethrough includes a fourth insulator.

41. A semiconductor device according to claim 32, wherein the insulator which is formed on the first impurity doped region of each one of said at least one IGFET and having an opening therethrough includes said first and second insulators.

42. A semiconductor device according to claim 32, wherein the insulator which is formed on the first impurity doped region of each one of said at least one IGFET and having an opening therethrough includes a fourth insulator.

* * * * *